US006408863B1

(12) United States Patent
Owczarz

(10) Patent No.: US 6,408,863 B1
(45) Date of Patent: *Jun. 25, 2002

(54) SEAL CONFIGURATION FOR USE WITH A MOTOR DRIVE ASSEMBLY IN A MICROELECTRONIC WORK PIECE PROCESSING SYSTEM

(75) Inventor: Aleksander Owczarz, Fremont, CA (US)

(73) Assignee: Semitool, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/610,175

(22) Filed: Jul. 5, 2000

Related U.S. Application Data

(62) Division of application No. 08/897,914, filed on Jul. 21, 1997, now Pat. No. 6,098,641.
(51) Int. Cl.$^7$ ................................................ B08B 13/00
(52) U.S. Cl. .................. 134/140; 134/157; 134/902
(58) Field of Search ........................ 134/902, 140, 134/153, 157, 159; 156/345 L, 345 LS

(56) References Cited

U.S. PATENT DOCUMENTS 5,022,419 A * 6/1991 Thompson et al. ..... 134/902 X
6,098,641 A * 8/2000 Owczarz ..................... 134/140

* cited by examiner

Primary Examiner—Philip R. Coe
(74) Attorney, Agent, or Firm—Polit & Associates, LLC

(57) ABSTRACT

An apparatus for processing a semiconductor wafer is set forth. The apparatus comprises a processing bowl that defines a processing chamber. The processing bowl is in fixed alignment with a frame. A wafer support structure adapted to support at least one wafer is mounted for rotation within the processing chamber. A motor drive assembly is disposed exterior to the processing chamber and connected to rotate the wafer support. The motor drive assembly includes an electrically driven motor and at least one shock absorbing member connected between the electrically driven motor and the frame. The electrically driven motor preferably includes a rotor shaft that rotates about an axis of rotation. The shock absorbing member is adapted to elastically deform in substantially all directions perpendicular to the axis of rotation of the rotor shaft in response to vibrational forces having components perpendicular to the axis of rotation and, to a lesser degree, in directions parallel to the axis of rotation of the rotating shaft in response to vibrational forces having components parallel to the axis of rotation. In accordance with a further, independently unique aspect of the present invention, an aggressive seal is provided to prevent materials, such as processing fluids, from entering the motor in the region of the motor rotor. To this end, expulsion threads are provided at an end of the rotor shaft of the motor. A member substantially surrounds the expulsion threads at the end of the rotor. Together, the member defines a chamber with the rotor. Rotation of the rotor and threads assist in preventing foreign materials from entering the motor.

10 Claims, 5 Drawing Sheets

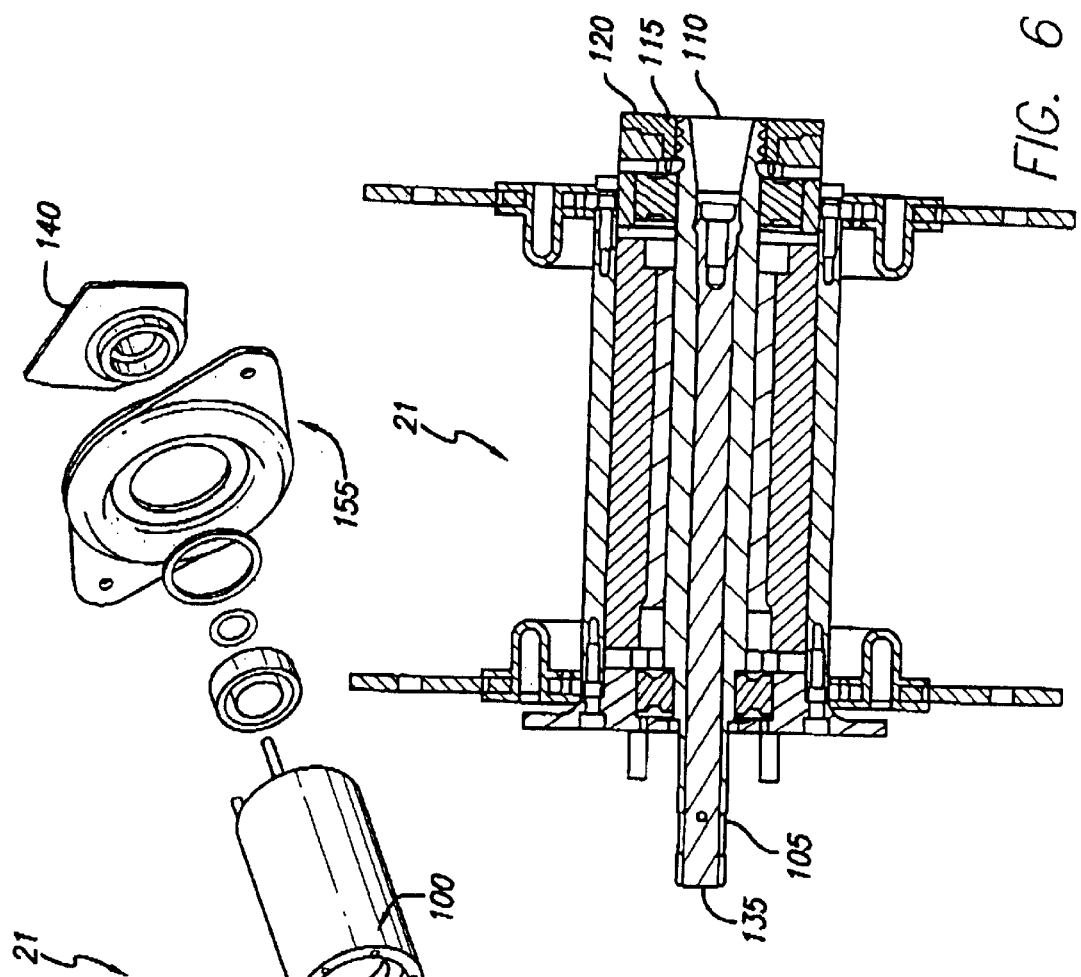
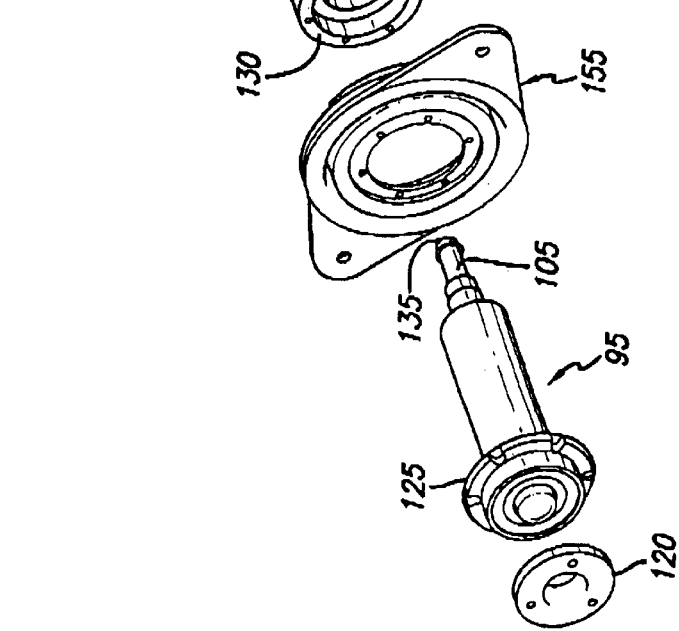
FIG. 5
FIG. 6

SEAL CONFIGURATION FOR USE WITH A MOTOR DRIVE ASSEMBLY IN A MICROELECTRONIC WORK PIECE PROCESSING SYSTEM

CROSS-REFERENCE TO RELATED APPLICATIONS

The present application is a divisional application of U.S. Ser. No. 08/897,914, filed Jul. 21, 1997, and now U.S. Pat. No. 6,098,641, which is hereby incorporated by reference.

STATEMENT REGARDING FEDERALLY SPONSORED RESEARCH OR DEVELOPMENT

Not Applicable

BACKGROUND OF THE INVENTION

This invention relates to an apparatus for processing semiconductor wafers or glass photomask plates, and more particularly, to a direct drive motor assembly for a semiconductor wafer processing system that improves the processing yield of semiconductor wafers.

In the production of integrated circuits, the semiconductor wafers or substrates from which the integrated circuit chips are cut are processed through multiple steps. The basic material for the substrates on the wafers may be silicon, glass, or ceramic materials of various sorts or other similar materials of very thin wafer-like configuration. This basic substrate is subjected to coating, etching, and cleaning processes and it is extremely important that each processing step is performed with the greatest possible yield allowing a decrease in production costs.

Semiconductor wafers and glass photomask plates have been processed by spinning them about a vertical axis where the wafers or masks are stacked vertically as described in U.S. Pat. No. 3,760,822 with various holding mechanisms such as vacuum chucks. This has led to further disadvantages where the wafer may be only processed on one side at a time without a significantly different processing rate, wherein the topside processes at a much faster rate than that of the underside.

Other processing devices such as described in U.S. Pat. No. 3,970,471, process each wafer individually. Although the wafer is rotated about a horizontal axis, such a device only can process a single wafer at each station and is expensive and time consuming.

To eliminate many of the problems noted above, the assignee of the present invention developed a wafer processing system and set forth and claim the system in U.S. Pat. No. 4,300,581, titled "Centrifugal Wafer Processor", issued Nov. 17, 1981. The invention set forth therein permits the processing of a plurality of wafers at the same time in a carrier. In accordance with that invention, semiconductor wafers or glass photomask plates are processed by inserting them into the carrier and placing the carrier in a rotor, which rotates around a substantially horizontal axis. Various fluids may be applied to the wafers uniformly through the spray nozzles while the wafers are being rotated.

The foregoing system includes built-in shock absorbers that extend vertically from a frame that supports a bowl into which the carrier is inserted. The shock absorbers assist in reducing the transfer of vibrational energy to the carrier. The reduction of vibration energy transfer facilitates a greater processing yield since the wafers are not subject to damaging mechanical stresses and strains. The present inventors have recognized a further manner in which to reduce the vibration energy transfer using a direct drive motor assembly having one or more shock absorbing structures associated therewith.

A still further problem present in the prior apparatus is the sealing of the motor to isolate it from exposure to materials, such as processing fluids. The present inventors have provided a unique solution to this problem by providing an aggressive seal about the rotor of the motor.

BRIEF SUMMARY OF THE INVENTION

An apparatus for processing a semiconductor wafer is set forth. The apparatus comprises a processing bowl that defines a processing chamber. The processing bowl is in fixed alignment with a frame. A wafer support structure adapted to support at least one wafer is mounted for rotation within the processing chamber. A motor drive assembly is disposed exterior to the processing chamber and connected to rotate the wafer support. The motor drive assembly includes an electrically driven motor and at least one shock-absorbing member connected between the electrically driven motor and the frame. The electrically driven motor preferably includes a rotor shaft that rotates about an axis of rotation. The shock absorbing member is adapted to elastically deform in substantially all directions perpendicular to the axis of rotation of the rotor shaft.

In accordance with a further, independently unique aspect of the present invention, an aggressive seal is provided to prevent materials, such as processing fluids, from entering the motor in the region of the motor rotor. To this end, expulsion threads are provided at an end of the rotor shaft of the motor. A member substantially surrounds the expulsion threads at the end of the rotor. Together, the member defines a chamber with the rotor. Rotation of the rotor and threads assist in preventing foreign materials from entering the motor.

BRIEF DESCRIPTION OF THE SEVERAL VIEWS OF THE DRAWINGS

FIG. 5 is an exploded view of a motor assembly constructed in accordance with one embodiment of the present invention.

FIG. 6 is a side, cross-sectional view of a motor assembly constructed using the components of FIG. 5.

DETAILED DESCRIPTION OF THE INVENTION

Figure 1:
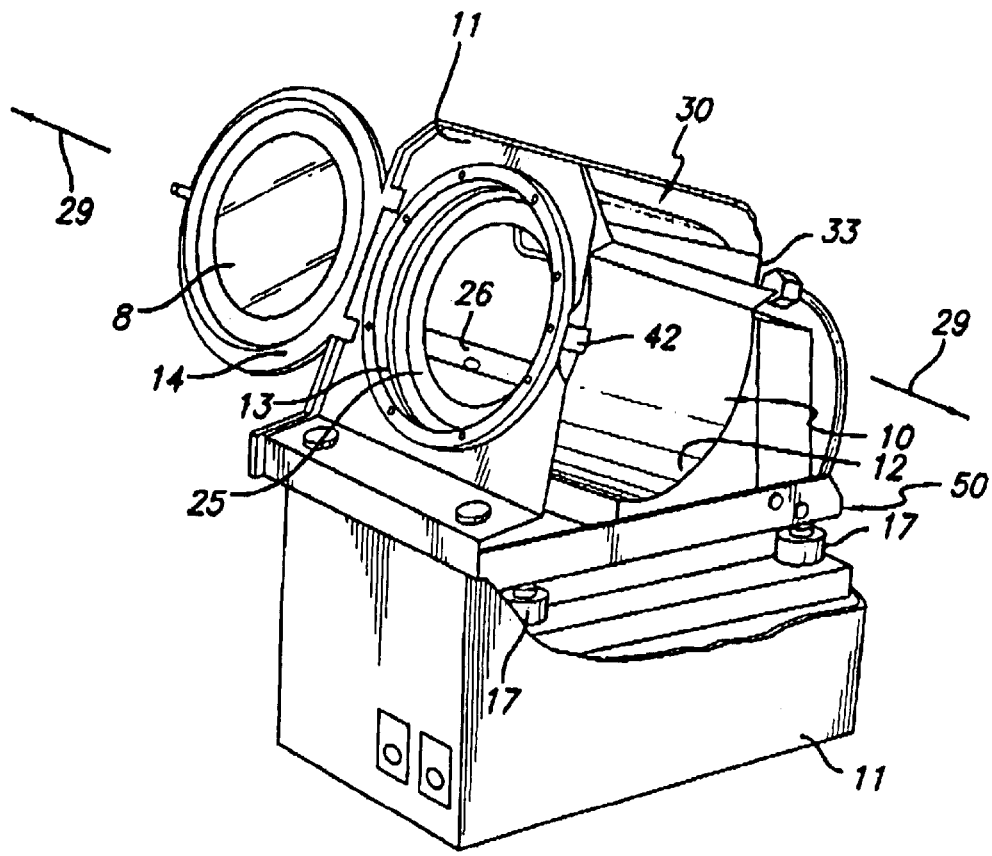
FIG. 1 is a perspective view of one embodiment of a semiconductor processing apparatus that may employ the motor mount and aggressive seal of the present invention.

Referring now to the drawings, an exemplary apparatus 10 for processing wafer or semiconductor components is illustrated in FIG. 1. This apparatus is merely one type of semiconductor processing apparatus in which the direct motor drive of the present invention may be used. Another similar processing apparatus that may employ the direct motor drive of the present invention is set forth in U.S. Pat. No. 5,022,419, titled "Rinser Dryer System", issued Jun. 11, 1991, and assigned to the assignee of the present invention. The teachings of both the '581 and '419 patent are incorporated by reference.

The exemplary apparatus 10, as shown in FIG. 1, has a somewhat rectangular outer configuration and a front opening. This style of apparatus is sometimes referred to as a front-loading processor, indicative of the manner in which semiconductor wafers are placed into the apparatus. The apparatus 10 includes a frame and cabinet assembly, shown generally at 11, which houses a stationary bowl 12 with a front opening 13. A hinged door 14 on the frame is arranged to seal with respect to a bowl opening 13 so that the bowl and door provide an enclosed processing chamber. Bowl 12 is preferably constructed of corrosion and solvent resistant material such as stainless steel, and is cylindrically shaped with a drain at the bottom for removal of processing fluids during the processing cycles.

A carrier rotor 15 is concentrically arranged within bowl 12. The carrier rotor includes support members 26, support rod 28, and support ring 25. Carrier rotor 15 is supported within bowl 12 for rotation about a rotation axis 29 in a known manner.

Figure 3:
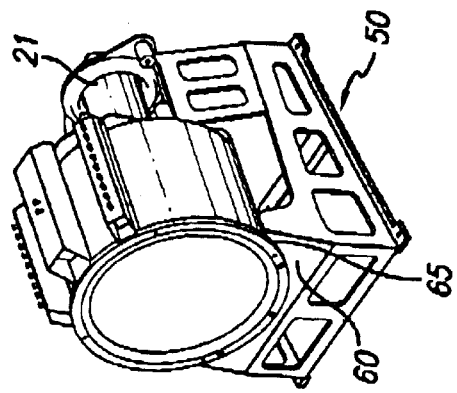
FIG. 3 is a perspective view of one embodiment of a bowl, motor assembly, and frame used in the apparatus of FIG. 1.

FIG. 3 shows the principal operational components of the upper section 30 of the apparatus 10 with various cabinet panels remove. As shown, the carrier rotor 15 is either directly or indirectly coupled to an electrically driven motor assembly 21 that has a rotor shaft having an axis of rotation 31 coinciding with the axis of rotation 29 of carrier rotor 15 when the apparatus is assembled. The motor assembly 21 provides a controlled rotational driving of carrier rotor 15 within bowl 12.

Figure 2:
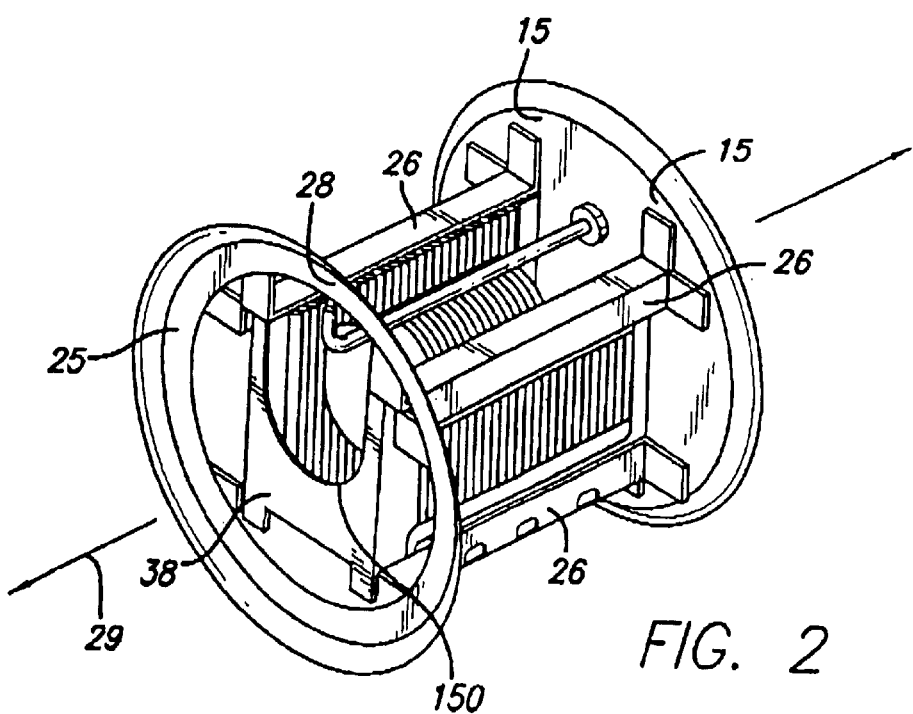
FIG. 2 is a wafer carrier rotor assembly for use in the apparatus of FIG. 1.
Figure 4:
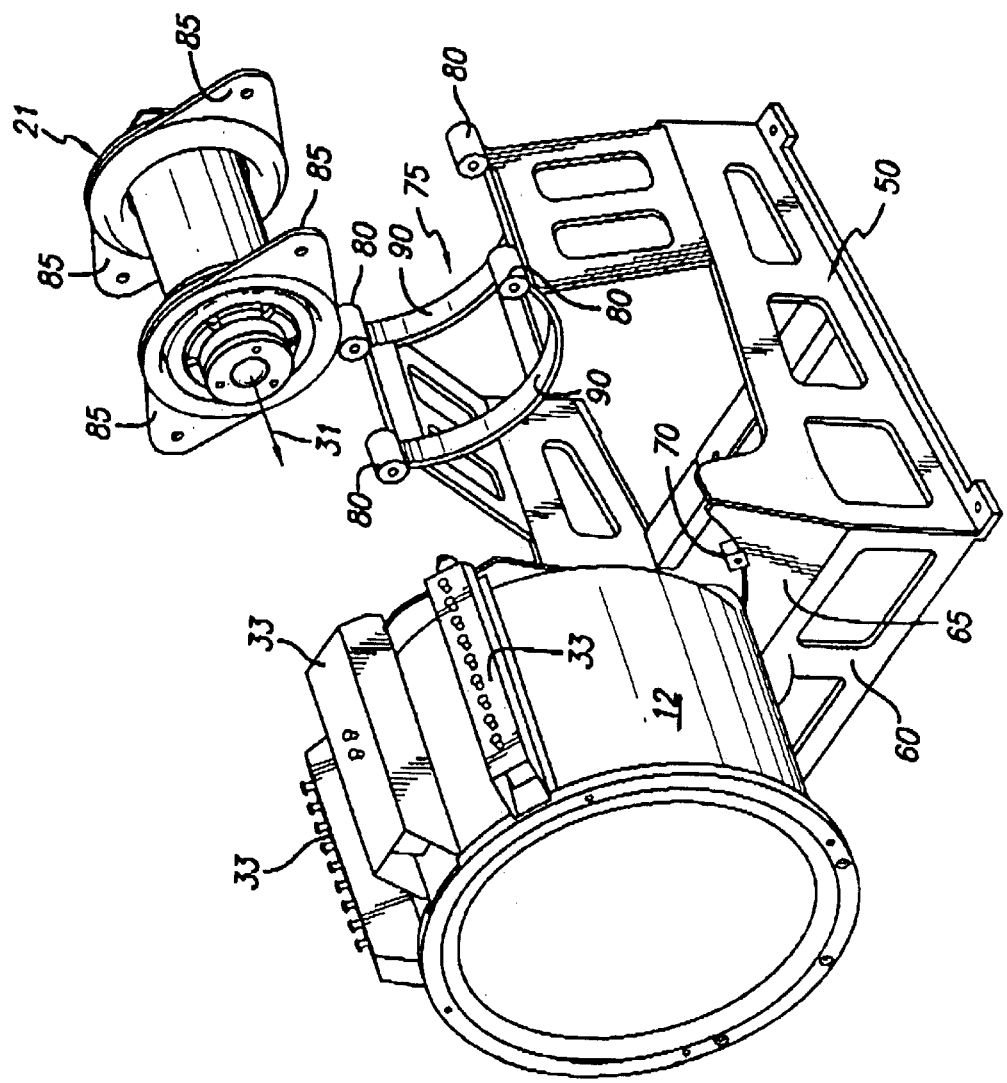
FIG. 4 is an exploded view of the components of FIG. 3.

As illustrated in FIGS. 3 and 4, bowl 12 is stationary and is connected to frame 50. In some systems, the frame 50 may be vibrationally supported by shock absorbers 17 (FIG. 1) within cabinet 55. The bowl 12 is provided with a plurality of spray members 33 that are disposed above and parallel to support members 26 of carrier rotor 15 to direct processing fluids toward wafers supported in the processing chamber by the carrier 38. Support member 26 and support rod 28 are coupled to support ring 25 as shown in FIG. 2, providing the outer support for carrier 38.

Frame 50 includes a front end 60 having a cutout 65 with attaching lugs 70 for securement with the bowl 12. The frame 50 further includes a motor support sub-frame 75 that is shaped to accept the electrically driven motor assembly 21. The motor support sub-frame 75 includes lugs 80 that provide means for securement with outer flange members 85 of the motor assembly 21 and concave cutout sections 90 that allow portions of the motor assembly 21 to fit within frame 50.

Figure 7:
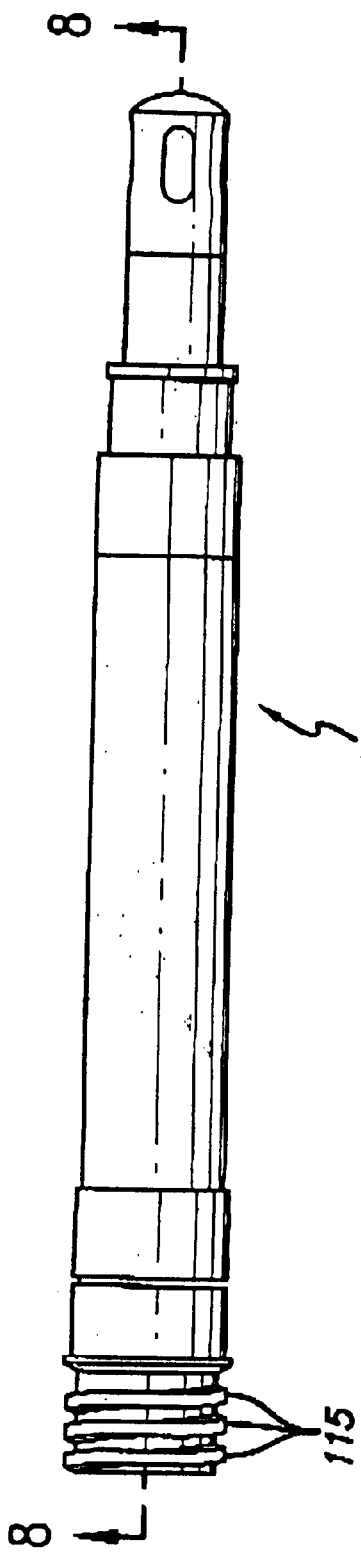
FIGS. 7 and 8 illustrate one embodiment of a rotor shaft suitable for use in the motor assembly of FIG. 6.
Figure 8:
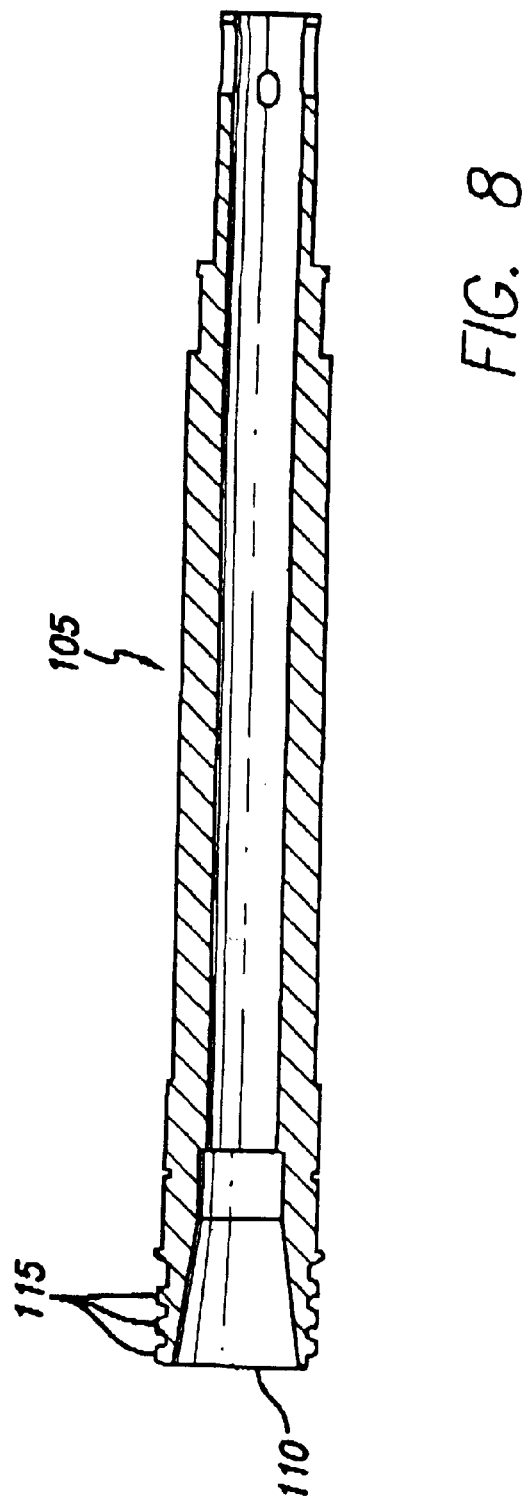

FIG. 5 illustrates an exploded view of various individual components of the motor assembly 21 while FIG. 6 illustrates a cross-sectional view of the assembled motor assembly 21. As illustrated, the motor assembly 21 comprises a motor rotor assembly 95 and a motor stator assembly 100. The motor rotor assembly 95 includes a central rotor shaft 105 having a proximal end 110 for either direct or indirect connection with the carrier rotor 15. Expulsion threads 115 are provided at an exterior surface of the rotor shaft 105 at the proximal end 110. A retaining member 120 made, for example, from stainless steel, is disposed over the proximal end of shaft 105 and seals with the otherwise exposed end portion of rotor assembly 95. The member 120 forms a close fit to the outside diameter of expulsion threads 115. Preferably, no direct contact is made between the expulsion threads 115 and member 120. The inner surface of member 120 forms a chamber with the proximal end of shaft 105. During operation, the rotational movement of shaft 105 and expulsion threads 115 urges any processing liquids proximate shaft 105 away from the motor assembly and back into the bowl 12. Further details concerning the particular embodiment of the central rotating shaft 105 used here are apparent from the views thereof in FIGS. 7 and 8. As illustrated in those figures, the expulsion threads 115 may have a helical configuration.

The motor rotor assembly 95 is disposed in a central opening of stator assembly 100 and has a flange 125 at its proximal end that engages and is secured to a mounting face 130 of the stator assembly 100. The distal end 135 of the motor rotor assembly 95 extends beyond the distal end of the stator assembly 100 to engage an end plate 140.

During operation of the apparatus 10, vibrational energy is generated. The vibrational energy may be generated external to apparatus 10 and transferred to carrier 15 and wafers 150 and, further, may be generated internally due, for example, to imbalance in the rotating members in the bowl 12. This vibrational energy may damage the wafers 150 in the carrier rotor 15 if precautions are not made to limit the transfer of this energy to the wafers 150. To this end, the motor assembly 21 is provided with shock absorbing members 155 disposed at both the proximal and distal ends of the motor assembly 21. These shock absorbing members 155, as best illustrated in FIGS. 3 and 4, are used to mount the motor assembly 21 to the frame 50 of the processing apparatus 10 thereby assisting in preventing the motor assembly 21 from transferring vibrational energy to the carrier rotor 15 and wafers 150 and, further, allowing receipt of vibrational energy from the frame 50. Such isolation limits the amount of vibrational energy that is ultimately absorbed by the carrier rotor 15 and wafers 150.

Figure 9:
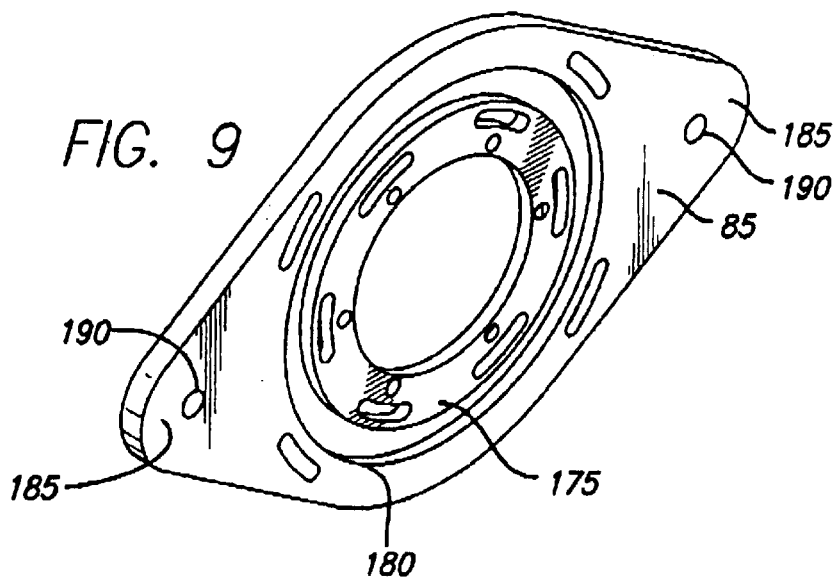
FIGS. 9–11 are various views of the shock absorbing assembly used in the embodiment of the motor assembly shown in FIGS. 5 and 6.
Figure 10:
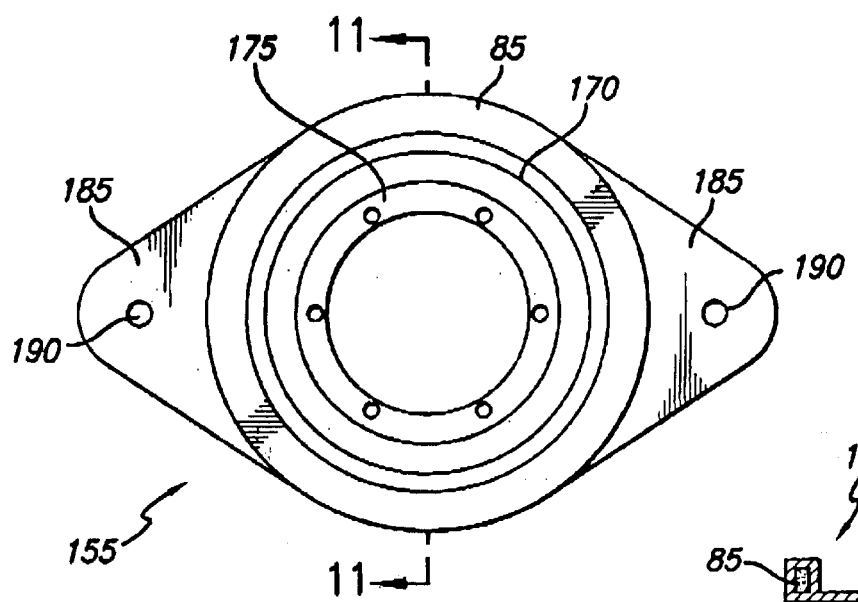
Figure 11:
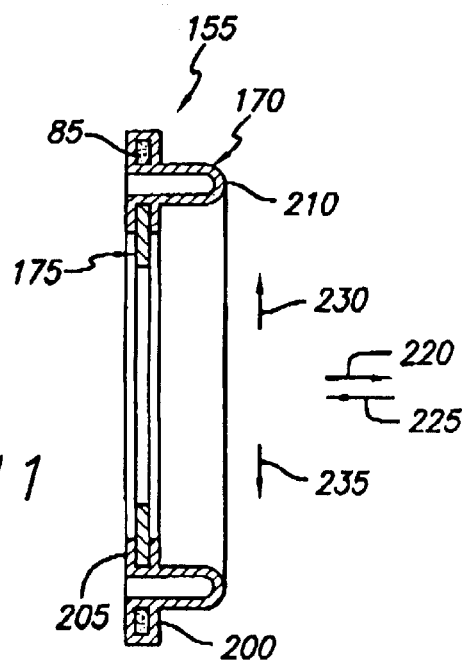

As illustrated in FIGS. 9–11, the shock absorbing members 155 are comprised of three parts: the outer flange member 85, a shock absorbing web 170, and a motor mount member 175. The outer flange member 85 includes a central aperture 180 and oppositely extending mounting ears 185. Each mounting ear 185 includes an aperture 190 for accepting a securement for securing the flange member 85 to the frame 50. The motor mount member 175 of the illustrated embodiment is generally circular in shape and has a plurality of apertures disposed about the circumference thereof to accept securements therethrough for securing the motor mount member 175 to the face of stator housing 100 and flange 125 of the rotor assembly 95. The motor mount member 175 has an outside diameter that is a predetermined degree smaller than the inside diameter of the central aperture 180 of the outer flange member 85. The difference in diameters allows the outer flange member 85 and the motor mount member 175 to be mounted concentric with one another with the shock absorbing web 170 extending about and, preferably, consuming the interstitial regions between them. In the illustrated embodiment, the shock absorbing member 155 is ultimately mounted about the stator housing 130 and rotor assembly 95 so that the centers of the apertures of both the outer flange member 85 and motor mount 175 are coincident with the axis of rotation 31 of the rotor shaft 105. It will be recognized that such shapes and the concentricity discussed here merely exemplify one embodiment of the motor assembly.

With particular reference to FIG. 11, it can be seen that the shock absorbing web 170 includes an outer peripheral lip 200 that engages and secures with the outer flange member 85 and an interior lip 205 that engages and secures with the motor mount member 175. An intermediate arched section 210 extends circumferentially about the shock absorbing web 170 in the region between the outer peripheral lip 200 and the interior lip 205. The shock absorbing web 170 is preferably made from a resilient material, such as urethane, that can absorb energy through deformation when subjected to vibrational forces and yet consistently return to its normal shape upon removal of the forces. The particular configuration illustrated here can elastically deform to some degree in directions such as 220 and 225 that are generally parallel to the axis of rotation 31 of the rotor shaft 105. However, significant elastic deformation occurs along directions, as at 230 and 235, that are generally perpendicular to the axis of rotation 31. As such, the shock absorbing web 170 effectively isolates the outer flange member 85 and frame 50 from the motor mount member 175, stator assembly 100, and rotor assembly 95 by elastically deforming in response to vibrational forces along and perpendicular to the axis of rotation 31. Such isolation reduces the amount of potentially damaging mechanical energy that ultimately reaches the wafers 150. Wafer processing yields are thus increased, thereby making use of the present invention very economical and beneficial.

In operation of the apparatus 10, semiconductor wafers in carrier 38 are placed in support members 26 of carrier rotor 15 as shown in FIG. 2. Support rod 28, as shown in FIG. 2, retains the semiconductor wafers in carrier 38 when carrier rotor 15 is revolving at relatively low RPM's. As the speed of rotation of carrier rotor 15 increases, the semiconductor wafers 150 are held in place by centrifugal force. The semiconductor wafers 150 are processed by the application of various fluids through spray members 33. Carrier rotor 15 rotates substantially around rotation axis 29. The axis of rotation of carrier rotor 15 coincides with the axis of rotation of rotor shaft 105 of the motor assembly 21. It is desirable that this angle of the axis of rotation be greater or lesser than exactly horizontal to prevent the semiconductor wafers from contacting each other during processing. If the semiconductor wafers or masks contact each other during processing, a surface tension may be formed which would prevent processing of the semiconductor wafers or masks in the area of contact resulting in a lower yield. In the preferred embodiment shown here, the angle of the axis of rotation is more or less 10 degrees above horizontal. This adds to the case of loading of the semiconductor wafers and as a result of the angle, carrier 38 easily slides into support members 26 without the requirement of a retaining device to prohibit carrier 38 from falling out of apparatus 10.

The high rate rotation of the semiconductor wafers by carrier rotor 15 allows the pressure of the processing fluids applied by spray members 33 to be low and therefore saving extensive costs in the elimination of high pressure equipment. Spray members 33 in the preferred embodiment separately carry the processing fluids and, further, the heated nitrogen used during drying to permit safe optimum performance.

During operation, the semiconductor wafer may be observed through optional window 18 of door 14. During the processing steps, excepting that with nitrogen, air is brought in through a vent in bowl 12, providing more efficient evacuation of the processing fluids through the drain. Apparatus 10 will not operate until door 14 is closed and locked with locking switch 42.

Various user interfaces are used to facilitate user control of parameters such as timing of various processing and rinsing steps, temperatures at which such processing steps are to take place, speeds at which the semiconductor wafers are rotated, etc. Such controls, however, are likewise not particularly pertinent to the present invention.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. An apparatus for processing a wafer, the apparatus comprising:

a processing bowl defining a processing chamber;

a wafer support structure adapted to support at least one wafer, the wafer support being mounted for rotation within the processing chamber;

a motor drive assembly disposed exterior to the processing chamber and connected to rotate the wafer support, the motor drive assembly comprising an electrically driven motor having a rotor that rotates about an axis of rotation, the rotor having expulsion threads at an end thereof that is proximate the wafer support structure; and a member substantially surrounding the expulsion threads at the end of the rotor proximate the wafer support structure, the member forming a chamber with the rotor, rotation of the rotor assisting in preventing foreign materials from entering the motor.

2. An apparatus for use in processing a microelectronic workpiece, the apparatus comprising:

a processing bowl defining a processing chamber;

a motor drive assembly connected to drive one or more components disposed in the processing chamber, the motor drive assembly comprising a motor, a shaft assembly connected to be driven by the motor about an axis of rotation, the shaft assembly having threads at an end thereof that is proximate the processing chamber; and a chamber forming member substantially surrounding the threads at the end of the shaft assembly proximate the processing chamber to form a chamber about at least a portion of the threads, rotation of the threads as the shaft assembly is driven by the motor thereby assisting in sealing the processing chamber from the motor along the shaft assembly.

3. An apparatus as claimed in claim 2 wherein the threads are in the form of a plurality of helical threads.

4. An apparatus as claimed in claim 2 wherein the shaft assembly is connected to drive a wafer support assembly disposed in the processing chamber.

5. An apparatus as claimed in claim 4 wherein the workpiece support assembly is adapted to support a plurality of microelectronic workpieces for batch processing in the processing chamber.

6. An apparatus as claimed in claim 2 and further comprising a shock absorbing member connected between the motor drive assembly and a frame of the apparatus, the shock absorbing member being adapted to elastic lead deform and substantially all directions perpendicular to the axis of rotation of the drive shaft assembly in response to vibrational forces having components perpendicular to the axis of rotation.

7. In an apparatus for use in processing a microelectronic workpiece, the apparatus comprising a processing area and a motor drive area, a sealing arrangement for a drive shaft extending between the processing area and the motor drive area comprising:

a plurality of threads at an end portion of the drive shaft that is proximate the processing area; and a chamber forming member substantially surrounding the threads at the end of the drive shaft proximate the processing area to form a chamber about at least a portion of the threads, rotation of the drive shaft and corresponding threads assisting in sealing the processing area from the motor drive area.

8. A sealing arrangement as claimed in claim 7 wherein the threads are in the form of a plurality of helical threads.

9. An apparatus as claimed in claim 7 wherein the shaft assembly is connected to drive a wafer support assembly disposed in the processing area.

10. An apparatus as claimed in claim 9 therein the workpiece support assembly is adapted to support a plurality of microelectronic workpieces for batch processing in the processing chamber.

* * * * *